United States Patent
Matsunaga (10) Patent No.: US 7,446,545 B2
(45) Date of Patent: Nov. 4, 2008

(54) ANISOTROPICALLY CONDUCTIVE SHEET

(75) Inventor: Hitoshi Matsunaga, Ebina (JP)

(73) Assignee: Unitechno Inc., Tokyo (JP)

( * ) Notice: Subject to any disclaimer, the term of this patent is extended or adjusted under 35 U.S.C. 154(b) by 1 day.

(21) Appl. No.: 11/417,072

(22) Filed: May 3, 2006

(65) Prior Publication Data

US 2006/0192577 A1   Aug. 31, 2006

Related U.S. Application Data

(63) Continuation-in-part of application No. 10/840,522, filed on May 6, 2004, now abandoned.

(30) Foreign Application Priority Data

May 8, 2003 (JP) ............................. 2003-129773
Dec. 24, 2003 (JP) ............................. 2003-427504

(51) Int. Cl.
*G01R 31/02* (2006.01)
(52) U.S. Cl. ..................................................... 324/754
(58) Field of Classification Search ................ None
See application file for complete search history.

(56) References Cited

U.S. PATENT DOCUMENTS

| | | | |
|---|---|---|---|
| 6,604,953 B2 * | 8/2003 | Igarashi et al. ................ 439/91 |
| 6,787,709 B2 | 9/2004 | Vinther |
| 6,841,876 B2 * | 1/2005 | Haruta et al. ................ 257/741 |
| 6,846,184 B2 | 1/2005 | Fan et al. |
| 6,870,385 B2 * | 3/2005 | Inoue et al. .................. 324/765 |
| 6,942,493 B2 | 9/2005 | Matsunaga |
| 7,049,836 B2 * | 5/2006 | Setaka ......................... 324/754 |
| 7,095,241 B2 * | 8/2006 | Setaka et al. ................ 324/754 |
| 7,190,180 B2 * | 3/2007 | Yamada et al. .............. 324/754 |
| 2001/0016435 A1 * | 8/2001 | Fujimura ..................... 439/66 |
| 2002/0060583 A1 * | 5/2002 | Kimura et al. ............... 324/765 |
| 2003/0092294 A1 | 5/2003 | Matsunaga |
| 2004/0028893 A1 * | 2/2004 | Inoue et al. .................. 428/328 |
| 2004/0224148 A1 * | 11/2004 | Matsunaga .................. 428/332 |
| 2007/0069743 A1 * | 3/2007 | Inoue et al. .................. 324/754 |

FOREIGN PATENT DOCUMENTS

JP   S52-95437   7/1977

(Continued)

*Primary Examiner*—Jermele M Hollington
(74) *Attorney, Agent, or Firm*—RatnerPrestia (57) ABSTRACT

An anisotropic conductivity sheet (10) comprising an insulating sheet (11) having a number of through-holes (12) and a number of conductive bodies is provided. The insulating sheet (11) has an inner layer (11A) of a heat resistant fuloro-elastomer and surface thin layers (11B, 11C) of heat-resistant engineering plastics. Each of the conductive bodies is a wire loop (13) formed to generally elliptic shape. They are arranged within each of the through-holes (12) so that long axis of each wire loop (13) extends in the thickness direction of the insulating sheet (11). The anisotropic conductivity sheet (10) is suitable to use for electrical test of a semiconductor devise (16), such as IC. A signal waveform-rectifying sheet (20) is preferably arranged on the anisotropic conductivity sheet (10). The signal waveform-rectifying sheet (20) has though-holes (22) in which electrical components for rectifying signals and currents, such as resistors (23A), LEDs (23B), LR circuits (23C) and capacitors (23D), are filled up.

18 Claims, 4 Drawing Sheets

FOREIGN PATENT DOCUMENTS

| | | |
|---|---|---|
| JP | H01-115186 | 5/1989 |
| JP | H01-115186 | 8/1989 |
| JP | H04-033283 | 2/1992 |
| JP | H05-152019 | 6/1993 |
| JP | H07-140480 | 6/1995 |
| JP | H09-035789 | 2/1997 |
| JP | H11-031541 | 2/1999 |
| JP | H11-154545 | 6/1999 |
| JP | 2000-243485 | 9/2000 |
| JP | 2000-338177 | 12/2000 |
| JP | 2001-126787 | 5/2001 |
| JP | 2001-223041 | 8/2001 |
| JP | 2003-043104 | 2/2003 |
| JP | 2003-149291 | 5/2003 |
| WO | WO99/41812 | 8/1999 |

* cited by examiner

ANISOTROPICALLY CONDUCTIVE SHEET

CROSS REFERENCE TO RELATED CASES

This application is a continuation in part of abandoned patent application Ser. No. 10/840,522 filed on May 6, 2004 now abandoned, which is based on Japanese patent applications Ser. No. 2003-129773 filed on May 8, 2003, and Serial No. 2003-427504 filed Dec. 24, 2003, the contents of which are incorporated herein by reference.

BACKGROUND OF INVENTION

1. Field of the Invention

The present invention relates to a novel anisotropically conductive sheet, particularly, relates to a novel anisotropically conductive sheet useful for testing semiconductor devises such as semiconductor integrated circuits, simply called as 'IC' hereinafter, to inspect their electrical properties and relates to an apparatus for testing the semiconductor devices including a novel electrical interface using the anisotropically conductive sheet.

2. Description of the Related Art

Up until now, there have been proposed a wide variety of conventional electrically conductive sheets or films having an electrical conductivity only in thickness direction thereof, which is applied to an electrical test of a semiconductor devise.

In order to test electrical properties of a semiconductor device such as IC, terminals of the semiconductor device shall be connected electrically with electrodes of test circuit. However, semiconductor devices have various own constructions each by each and it is necessary to use appropriate means for assuring electrical connections between terminals of the semiconductor device and electrodes of the test circuit.

As one of such connecting means, an anisotropically conductive film is proposed in Japanese published patent application Kokai H07-140480A. The anisotropically conductive film comprises a composition in which conductive fine particles are dispersed in an insulating adhesive material.

At test stage of a semiconductor device, the anisotropically conductive film is laid between terminals of the semiconductor device and electrodes of test circuit and then compresses the semiconductor device toward the circuit of tester through the anisotropically conductive film to connect electrically the both.

Most of recently developed semiconductor devices, for example IC, are higher integrated and, therefore, the semiconductor devices becomes to high temperature, for example above 100° C., at test stage due to electric currents given to the semiconductor devices. In order to meet such high temperature, an anisotropically conductive film made of heat resistant materials is proposed. However, vibrations of the film take place by an outside pressure and static electricity is generated on the film during the test procedure. These problems cause difficulties to obtain exact test results.

Furthermore, when a semiconductor device to be inspected is pressed down to test circuit through the anisotropically conductive film, the film often adheres to the semiconductor device and/or the circuit board, for a vacuum space is formed between the semiconductor device and the circuit board by such pressing down. Thus, the film is occasionally damaged when the semiconductor device and the films are removed respectively from the circuit board after the test is finished.

For avoiding such drawbacks, an anisotropically conductive sheet has been suggested in Japanese published patent application Kokai H09-35789A. The anisotropically conductive sheet comprises an insulating material composed of silicone rubber and an electrically conductive material existing in the insulating material.

As the anisotropically conductive sheet has an adequate thickness, any vibration or adherence of the sheet does not appear. However, an oily material oozes out from the insulating material during the test, because the insulating material of the conductive sheet is made of silicone rubber. The oily material may pollute the semiconductor device and the circuit board of tester and it may bring troubles on a normal test. Since the oozing out of the oily material is increased at higher temperature, this anisotropically conductive sheet is unsuitable to apply for testing highly integrated IC, which rises in temperature during the test.

Furthermore, as the above anisotropically conductive sheet comprises a conventional conductive material, such as a conductive material having a ball-like shape, the ball-like conductive material may be deformed and damaged when a semiconductor device is pressed down toward the circuit board of tester through the anisotropically conductive sheet.

SUMMARY OF THE INVENTION

It is, therefore, an object of the present invention is to provide an improved anisotropically conductive sheet which is able to establish reliable electrical connection between terminals of a semiconductor device, such as IC, with electrodes of test circuit without drawbacks mentioned above, and to obtain accurate test results, even if the semiconductor device becomes high temperature during the test.

It is another object of the present invention to provide a novel apparatus for testing a semiconductor device including a novel electrical interface using the anisotropically conductive sheet.

According to the present invention, there is provided an anisotropically conductive sheet comprising: (a) an insulating sheet having a thickness said insulating sheet comprising an inner layer composed of a heat resistant fluoro-elastomer and thin surface layers composed of a heat resistant engineering plastic on upper and lower surfaces of said inner layer, and a plurality of through holes extending through said sheet thickness, said through holes having an axis extending the thickness of said sheet, and an inner surface; (b) a plurality of electrically conductive wire loops each of said loops having a generally elliptic shape comprising a long and a short axis and two wire ends, wherein said wire loops are inserted in said plurality of through holes respectively with said long axis generally parallel to said hole axis, and wherein said wire loops and said wire ends are in pressed contact with said inner walls of said through holes to hold said wire loops in said holes.

The anisotropically conductive sheet has through-holes passing through the insulating sheet and in each of the through-holes a loop of a conductive wire shaped as ellipse or the like is held so that long axis of the elliptic loop extends in thickness direction of the insulating sheet whereby connect electrically terminals of a semiconductor device with electrodes on an electrical circuit of tester.

The anisotropically conductive sheet of the present invention is laid between electrically terminals of a semiconductor device under test and electrodes of the circuit of tester, to establish electrical connections between both.

According to the present invention, there is also provided an apparatus for testing a semiconductor device comprising an anisotropically conductive sheet and an electrical circuit tester wherein said anisotropically conductive sheet is adapted to be placed between said semiconductor device and said electrical circuit tester to provide electrical connections between terminals on said semiconductor device and electrodes on said circuit tester, said anisotropically conducting sheet comprising: (a) an insulating sheet having a thickness said insulating sheet comprising an inner layer composed of a heat resistant fluoro-elastomer and thin surface layers composed of a heat resistant engineering plastic on upper and lower surfaces of said inner layer, and a plurality of through holes extending through said sheet thickness, said through holes having an axis extending the thickness of said sheet, and an inner surface; (b) a plurality of electrically conductive wire loops each of said loops having a generally elliptic shape comprising a long and a short axis and two wire ends, wherein said wire loops are inserted in said plurality of through holes respectively with said long axis generally parallel to said hole axis, and wherein said wire loops and said wire ends are in pressed contact with said inner walls of said through holes to hold said wire loops in said holes.

According to the present invention, there is further provided that an electrical interface for connecting terminals of a semiconductor device and corresponding electrodes of a tester for testing said semiconductor device, said interface comprising an anisotropically conductive sheet and a signal waveform-rectifying sheet for adjusting profiles of signal waves or electrical currents inputting into and/or outputting from said semiconductor device, wherein: said anisotropically conductive sheet comprises: (a) an insulating sheet having a thickness said insulating sheet comprising an inner layer composed of a heat resistant fluoro-elastomer and thin surface layers composed of a heat resistant engineering plastic on upper and lower surfaces of said inner layer, and a plurality of through holes extending through said sheet thickness, said through holes having an axis extending the thickness of said sheet, and an inner surface; (b) a plurality of electrically conductive wire loops each of said loops having a generally elliptic shape comprising a long and a short axis and two wire ends, wherein said wire loops are inserted in said plurality of through holes respectively with said long axis generally parallel to said hole axis, and wherein said wire loops and said wire ends are in pressed contact with said inner walls of said through holes to hold said wire loops in said holes; and said signal waveform-rectifying sheet comprises: an heat resistant insulating sheet comprising an elastomer and having a thickness said heat resistant insulating sheet further comprising a plurality of through-holes extending through said heat resistant insulating sheet thickness, and at least one signal waveform rectifying component arranged in at least one of said through-holes in said heat resistant insulating sheet.

BRIEF DESCRIPTION OF THE DRAWINGS

FIGS. 1A, 1B and 1C illustrate a construction of an anisotropically conductive sheet, which is an embodiment of the present invention.

FIGS. 4A and 4B illustrate an embodiment of an apparatus for testing or inspecting ICs using the anisotropically conductive sheet.

DETAILED DESCRIPTION OF THE PREFERRED EMBODIMENTS

The present invention will hereinafter be described in details with reference to the accompanying drawings.

Figure 1A:
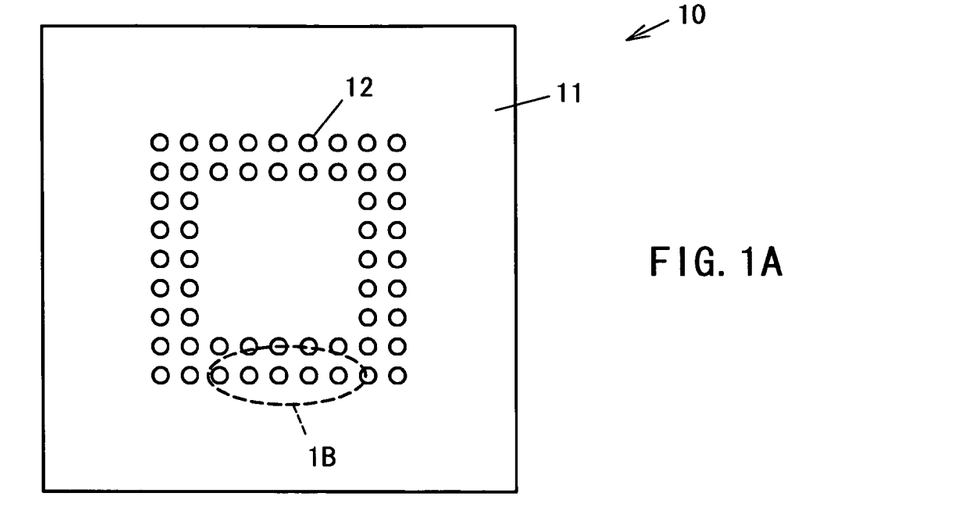
FIG. 1A is a plane view of the whole anisotropically conductive sheet.
Figure 1B:
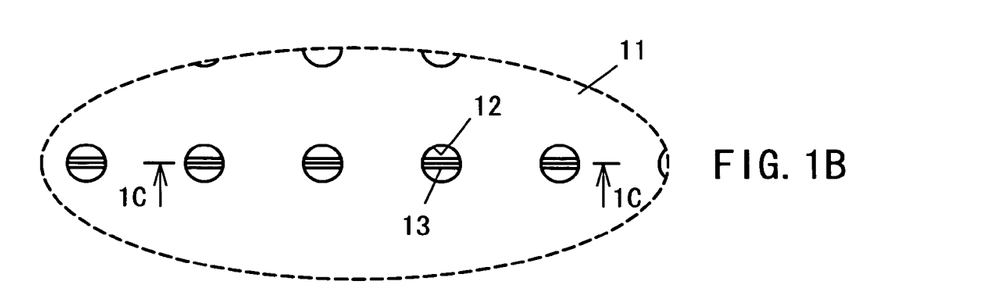
FIG. 1B is an enlarged plane view of a part of the anisotropically conductive sheet.
Figure 1C:
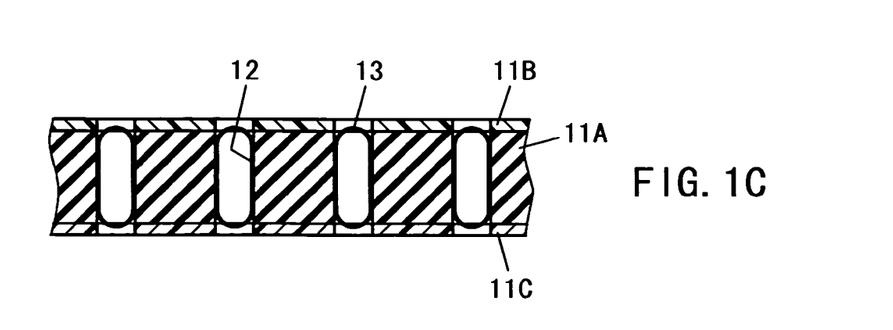
FIG. 1C is an enlarged cross-sectional view of the part of the anisotropically conductive sheet.

FIG. 1A shows a plan view of an exemplary anisotropically conductive sheet according to the present invention. FIG. 1B shows an enlarged plane view of a part of the anisotropically conductive sheet and FIG. 1C shows 1C-1C cross-section of the part shown in FIG. 1B.

As seen from these drawings, an anisotropically conductive sheet 10 according to the present invention comprises basically an insulating sheet 11 and elliptic loops 13 of conductive wires as electrically conductive bodies fitted in the insulating sheet 11.

The insulating sheet 11 constituting the anisotropically conductive sheet 10 of the present invention comprises an inner layer 11A composed of a heat-resistant fluoro-elastomer, which is an insulating polymeric material having an appropriate elasticity and excellent thermal stability. 'Viton'.TM. (a product of DuPont Dow Elastomers), 'Dyneon'.TM. (a product of 3M), 'AFLAS'.TM. (a product of Asahi-Glass company, Ltd.) and 'DAI-EL'.TM. (a product of Daikin Industries, Ltd.) are indicated as preferable examples of the fluoro-elastomers.

There is no oozing-out of materials from the insulating sheet 11 even if it is used under high temperature, because the fluoro-elastomer has an excellent heat-resistance. As compared with this sheet, insulating sheets made of silicone rubber or the like constituting conventional anisotropically conductive sheets often ooze out oily materials at high temperature.

Figure 3:
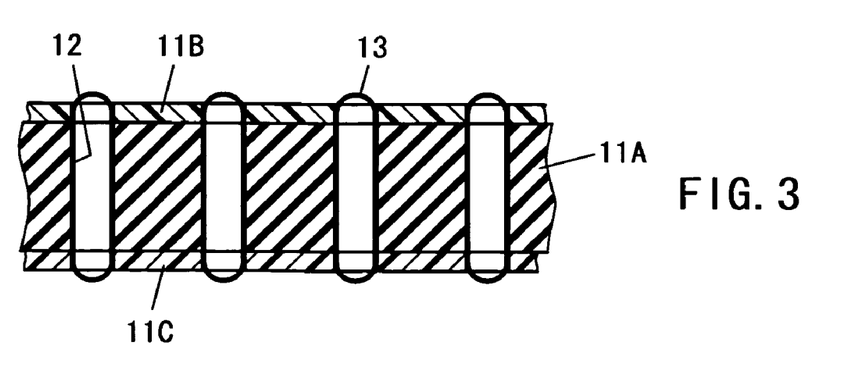
FIG. 3 is an enlarged cross-sectional view of a part of another anisotropically conductive sheet of the present invention.

The inner layer 11A of the insulating sheet 11 has preferably a thickness of about 0.15 to 1.2 mm, more preferably a thickness of about 0.2 to 1.0 mm. As illustrated in FIG. 1C and FIG. 3, the insulating sheet 1 further comprises thin surface layers 11B and 11C made of engineering plastics, which are formed on both of front and back surfaces of the inner layer 11A, respectively.

The thin surface layers 11B and 11C are composed of one or more heat resistant engineering plastics, such as polyimide and/or polyetheretherketone (PEEK). The surface layers 11B and 11C cover generally all surfaces area of the insulating sheet 11 excepting openings of the through-holes. Each of the surface layers 11B and 11C of engineering plastics has a thickness of about 0.005 to 0.1 mm, preferably about 0.01 to 0.1 mm. The thin surface layers 11B and 11C may be formed by coating of a solution, dispersion or melt of the engineering plastics or by laminating of a thin film composed of the engineering plastics on both surfaces of the insulating sheet 11.

The anisotropically conductive sheet 10 having such mufti-layer structure is excellent in mechanical properties and dimension stabilities of whole structure as it is reinforced by engineering plastics layers and, further, in accuracy of positioning of the through-holes. In addition to the above, damages of elliptic wire looped 13 during test become fewer and, therefore, the certainty of test and life of the anisotropically conductive sheet 10 are remarkably improved.

As illustrated in the drawings, the insulating sheet 11 has a plurality of through-holes 12 passing through the insulating sheet 11 from front surface to back surface thereof. Each of the through-holes 12 preferably has circular cross section to form a small cylindrical space through the insulating sheet 11. Although the cross section of through-holes 12 illustrated in FIGS. 1A and 1B is circle, the cross section of through-holes 12 include other shapes, such as, by way of example and not as a limitation, ellipse, square, pentagon, hexagon or octagon.

A preferable diameter of each through-hole is in a range of about 45 to 65% of the thickness of the insulating sheet 11, namely a range of about 0.067 to 0.78 mm. A length of each through-hole 12 generally depends upon the thickness of the insulating sheet. As mentioned above, a preferable thickness of the insulating sheet 11 is in a range of about 0.15 to 1.2 mm and therefore preferable length of the through-hole 12 is also in a rang& of about 0.15 to 1.2 mm. Each through-hole 12 has preferably a uniform diameter over the entire length thereof. The central portion of the through-hole 12, however, may be narrower than upper and lower entrance portions, for the elastic material of the inner layer 11A will protrude to inside of the throgh-hole 12 after completion or during use of the anisotropically conductive sheet 10 in most cases.

Positions of the through-holes 12 on the insulating sheet 11 are arranged depending on a layout of terminals of IC to be inspected. For example, through-holes 12 are lined up as shown in FIG. 1A so as to correspond to a layout of the terminals of IC.

The anisotropically conductive sheet 10 comprises generally elliptic loops 13 of a conductive metal wire. Each of the wire loops 13 is inserted into each of the through-holes 12 of the insulating sheet 11 one by one as indicated in FIG. 1C. Each wire loop 13 is held in each through-hole 12, so that the long axis of the elliptic loop extends in the thickness direction of the insulating sheet 11.

Thus, the wire loops 13 held in the through-holes 12 are arranged so that the long axis of the elliptic loops 13 are extending longitude direction of the through-hole 12 and they function as an electrically conductive part of the anisotropically conductive sheet to connect electrically terminals of IC with electrodes of test circuit.

Each wire loop 13 is made of a thin wire of an electrically conductive metal, preferably a conductive metal having low hardness. Among them, aluminum, copper, silver and alloys thereof are most preferable. However, irons including steel, iron alloys and other conductive metals also may be used.

The diameter of the thin wire is preferably about 60 to 200 μm. In the case that the metal wire is too thin, it is difficult to form elliptic loops thereby and if the wire is too thick, it is not easy to insert the elliptic loop of the wire into the through-hole.

Figure 2A:
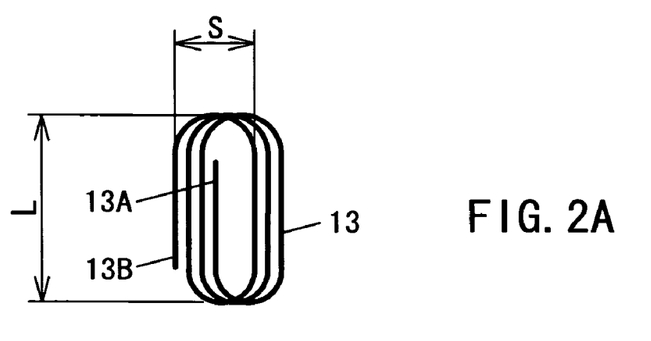
FIGS. 2A and 2B are, respectively, an enlarged side view of examples of the generally elliptic wire loops, which constitute electrical conductive parts of the anisotropically conductive sheet of the present invention.

A preferable example of the generally elliptic loop 13 of the conductive metal wire is shown in FIG. 2A. The elliptic loop 13 is desirably prepared by winding or coiling the metal wire for plural turns, particularly three to ten turns as illustrated in FIG. 2A. The multi-turned loop 13 is able to have a broad contacting area with terminals of IC and it brings more stable electrical conductivities at test stage. As the result, accuracy and reliability of the test can be enhanced. Therefore, although each elliptic loop of the metal wire is illustrated as a single line in the drawings other than FIG. 2A, it should be understood that the single line might indicate the loop of a bundle of metal wires.

Both sides of the each wire loop contact tightly with an inner wall of the through-hole 12 and, in most cases, each of the head and tail ends 13A and 13B of the looped wire contact strongly with the inner wall of the through-hole 12, whereby each wire loop 13 is held and fixed firmly in each through-hole 12.

Figure 2B:
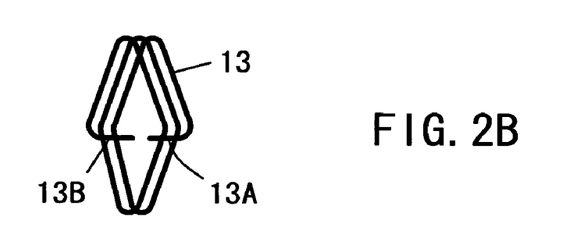

Another preferable example of the generally elliptic loop 13 is shown in FIG. 2B. The elliptic loop 13 has a modified elliptic shape which has a tapered top and bottom portion in the loop. Both wire ends of the loop preferably are bent towards inside of the loop to contact and stuck into inner walls of the trough-holes. Thus, 'generally elliptic loop' in the present invention includes modified shapes, such as a rhombic shape having rounded edges, which is derived from an ellipse or oval shape.

A size of the generally elliptic wire loops 13 should be chosen depending upon the size of the through-holes 12. In general, it is preferable that each of the wire loops 13 has a long diameter (L) of about 0.2 to 1.3 mm and a short diameter (S) of about 0.05 to 0.6 mm. More preferably, the long diameter (L) is slightly larger than the thickness of the insulating sheet 11 or equal to the same.

Although the generally elliptic wire loop 13 illustrated in FIG. 1C exists entirely in the through-hole 12, the top and bottom portions of elliptic loop 13 may project out slightly from upper and lower ends of the through-hole 12. In such embodiment, only top and bottom portions of the elliptic wire loop 13 are projecting out slightly from both ends of the through-hole 12, as indicated in FIG. 3.

An embodiment of applying the anisotropically conductive sheet 10 for testing electrically a semiconductor device, such as IC, is explained hereinafter, referring to FIGS. 4A and 4B. Each of the insulating sheets of these drawings also has a multi-layer structure comprising an inner layer 11A and surface layers 11B, 11C just like the insulating sheet of FIGS. 1C and 3.

Figure 4A:
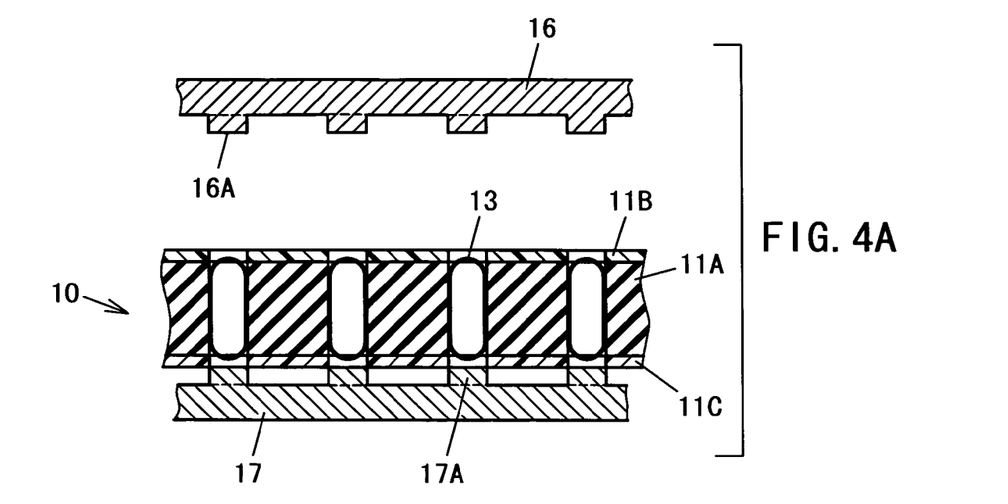
FIG. 4A is a cross sectional view of an arrangement of IC to be tested and the anisotropically conductive sheet at preparing stage for test.

FIG. 4A shows a simplified cross sectional view of a preparing stage of the electrical test of IC 16. The IC 16 having a number of terminals 16A is illustrated in upper potion of the drawing, and an anisotropically conductive sheet 10 of this invention and electrode pads 17A of a circuit board 17 of a tester is also illustrated in lower portion of the drawing, where the anisotropically conductive sheet 10 is put just on the circuit board 17 of tester. The electrode pads 17A of the upper surface of the circuit board 17 are arranged in a pattern of corresponding to a pattern of terminals 16A of IC 16.

Figure 4B:
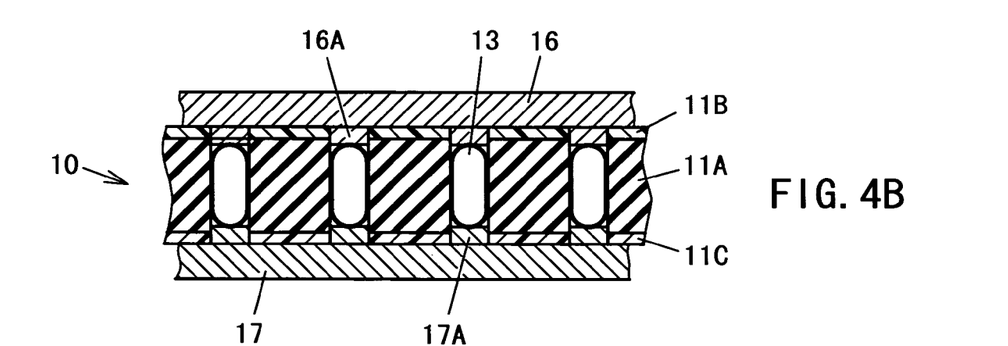
FIG. 4B is a cross sectional view of the arrangement at test stage.

FIG. 4B shows a simplified cross sectional view of a testing stage. IC 16 is put on the anisotropically conductive sheet laid over the circuit board 17 of the tester, and then IC 16 is pressed down toward the circuit board 17, so that terminals 16A of the IC 16 and electrode pads 17A in the circuit board 17 are electrically connected by the elliptically looped wires 13 of an anisotropically conductive sheet 10, whereby an electrical connection between the IC terminals 16A and the electrode pads 17A is securely established. At the test stage, an electric current is conducted into whole components to inspect electrical properties of IC 16. During the current test, a highly integrated IC 16 often rises in temperature and, however, any material oozed from the anisotropically conductive sheet 10 is not observed, even at high temperature.

As the insulating sheet of the anisotropically conductive sheet 10 comprises an inner layer 11A of a heat-resistant elastomer and two surface layers 11B, 11C of heat-resistant plastics, any oily material does not appear even if the test is undertaken at elevated temperature. Consequently, electrical connections between terminals 16A of high-integrated IC 16 and electrode 17A of the electrical circuit 17 are assured during whole test stages using the anisotropically conductive sheet 10.

Since generally elliptic loops 13 of conductive wire in the through-holes 12 have elasticity against a vertical pressure, the elliptic loops 13 can absorb unevenness and projections of IC terminals 16A when IC 16 is pressed down to the anisotropically conductive sheet 10. As the results, an accurate electrical connection between IC terminals 16A with electrodes 17A of the electrical circuit 17 is established by the anisotropically conductive sheet 10 of the present invention. Furthermore, damages of IC terminals 16A and electrodes 17A of the electrical circuit 17 can be minimized, for the elliptically looped wires 13 are possible to deform temporally to avoid damaging the terminals.

In addition to the above, since the wire loop 13 are held vertically in through-holes 12, it is possible to shorten diameter of the through-holes 12 and to minimize spaces between neighboring through-holes, and therefore the through-holes 12 can be arranged at fine intervals. Accordingly, the anisotropically conductive sheet 10 of this invention is suitable to use for tests of IC 16 on which many terminals 16A are arranged tightly. That is, the vertical arrangement of the wire loops 13 in the through-holes 12 makes easy to minimize area where the conductive materials occupy on the insulating sheet, comparing with ball-like conductive materials, Furthermore, fine air paths are formed naturally between inner walls of the through-holes 12 and the elliptic wire loops 13, where air can pass through when the IC is pressed down toward the anisotropically conductive sheet 10. The fine air paths prevent from sticking of IC 16 to the anisotropically conductive sheet 10 and consequently it become easy to remove the IC 16 from the anisotropically conductive sheet 10, after the test is completed.

Furthermore, the anisotropically conductive sheet according to the invention can be prepared for lower cost than conventional one. This is important from economical viewpoint.

As understood from the above, an anisotropically conductive sheet in accordance with this invention has many advantageous effects. Using this sheet, steady tests of semiconductor devices can be carried out without any damages of the semiconductor devices and circuits of testers and without problems of test under high temperature, and thus reliable test results can be obtained.

An apparatus for testing or inspecting a semiconductor device, such as IC, can be constructed by arranging the anisotropically conductive sheet described above on electrodes of test circuit. The anisotropically conductive sheet is laid over the electrodes and a semiconductor device to be inspected is put on it to perform the test, as illustrated in FIGS. 4A and 4B. And then electric currents are conducted into the construction to start the test.

However, it is preferable that test is performed under the arrangement of another connecting sheet (not shown in the drawings) between IC and the anisotropically conductive sheet of the present invention. A preferred example of such connecting sheet developed by Hitoshi Matsunaga is disclosed in Japanese published patent application Kokai 2003-149291A.

As intensity and voltage of electrical currents inputted into IC terminals from power lines and base lines are sometimes unstable and imbalanced and further signals furnished from IC terminals to the tester include turbulences in their waveforms and contain various kinds of noises. However, these problems can be solved by laying a novel sheet for adjusting signal waveforms, namely a signal waveform-rectifying sheet, on the anisotropically conductive sheet.

In preferable test procedures, therefore, the signal waveform-rectifying sheet is laid between the IC terminals 16A and the anisotropically conductive sheet 10 in order to improve accuracy of the test.

Figure 5:
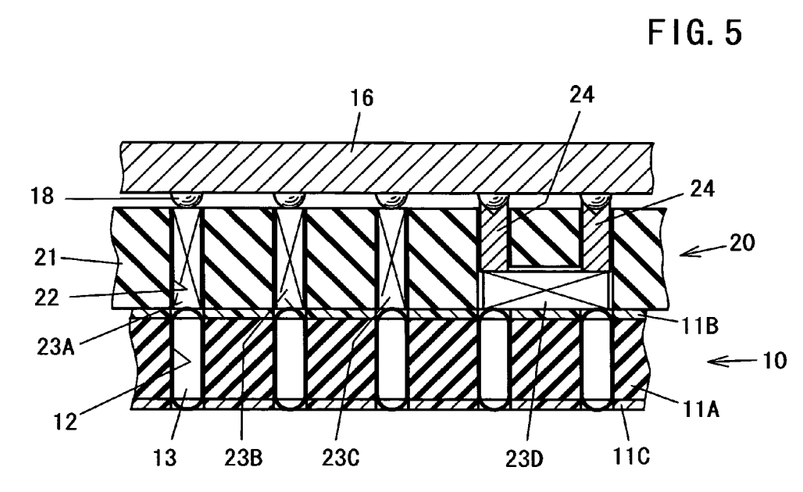
FIG. 5 is a cross sectional view of an assembly including the electrical interface according to the present invention, in which a signal waveform-rectifying sheet is arranged between the IC and the anisotropically conductive sheet.

FIG. 5 shows an example of an electrical interface using the signal waveform-rectifying sheet 20. The signal waveform-rectifying sheet 20 comprises a substrate sheet 21 made of electrically insulating elastic material, such as a heat resistant fluoro-elastomer, and the substrate sheet 21 has a plurality of through-holes 22 extending in its thickness direction. Each of the through-holes 22 is arranged in the position respectively corresponding to the though-holes 12 of the anisotropically conductive sheet 10, which comprises an insulating sheet having an inner layer 11A and two surface layers 11B, 11C and the elliptic wire loop 13, and to terminals of IC 16. Into each of the though-holes 22, an electrical component is inserted and fixed therein, by which the waveforms of signals and/or currents into or from IC are adjusted and stabilized.

The electrical component, namely a signal waveform-rectifying component, inserted into each through-hole 22 is selected depending upon functions of the corresponding terminals of IC 16. For example, as to the through-holes 22 corresponding to signal lines, the component is selected from a resistor 23A; LED (light emitting diodes) 23B and LR circuit 23C, i.e., a circuit containing an inductor and a resistor. In the other hand, into the through-holes 22 corresponding to power line or base line, a capacitor (condenser) 23D is selected as the electrical component. These signal waveform-rectifying components have functions to adjust intensities of electrical currents inputted to terminals of IC 16 and reduce noises in signals outputted from the terminals.

As to a through-hole 22 not necessary to adjust electrical currents or signals, a conductive piece 24 consisting of a conductive metal, such as a BoCu or carbon steel, is inserted to form a normal electrical path.

The thickness of the insulating sheet 21 is chosen depending on the sizes of the component inserted into the through-holes 22. However, it is generally preferable that the sheet 21 has a thickness of about 0.5 to 1.0 mm and each of the through-holes 22 has an inner diameter of about 0.3 to 0.6 mm. Cross section of each through-hole 22 is not limited to only a circle but also a square and other polygonal shape are available. In case where the electrical component has a cylindrical shape or the like, the through-hole having a circular cross section is preferable.

As illustrated in FIG. 5, each of a resistor 23A, LED 23B and LR circuit 23C is generally inserted into the through-hole 22 vertically. However, a flat capacitor 23D may exist in the insulating sheet 21 as extending to two or more through-holes 22. In through-holes having the capacitor 23D, supplemental conductive metal pieces 24 may be inserted just on the capacitor 23D to connect in series so as to fill up conductive path in the through-hole 22.

The signal waveform-rectifying sheet 20 mentioned above is effective to adjust and average the electrical current from terminals of IC 16 to the circuit board 17 of tester and to reduce noises of signals from the respective terminals. Thus, electrical currents or signals conducted to the electrodes of the circuit board of tester through the signal waveform-rectifying sheet 20 have most appropriate values and profiles and noises are remarkably reduced.

Figure 6:
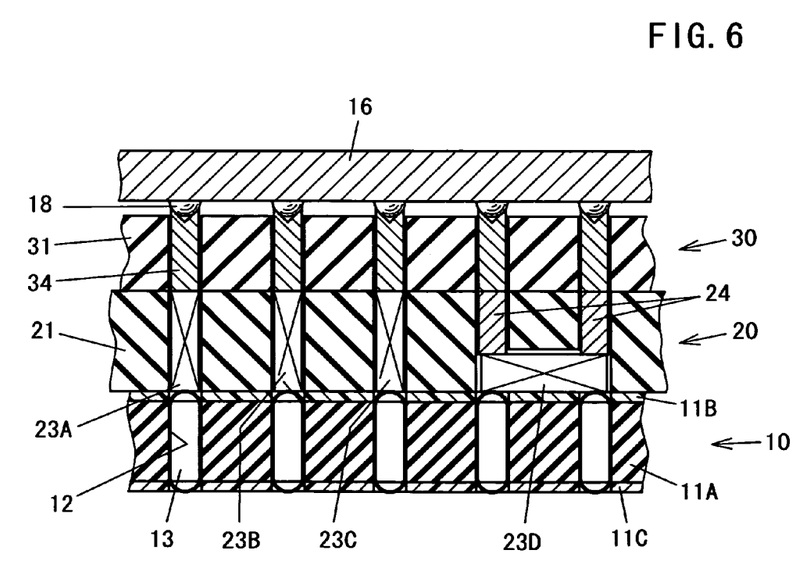
FIG. 6 is a cross sectional view of another assembly including the electrical interface according to the present invention, in which a contact sheet is laid additionally between the IC and the signal waveform-rectifying sheet.

In the case that the terminals of IC 16 under test are formed as ball-like or semi-ball like bumps 18 such as a solder ball indicated in FIGS. 5 and 6, the bumps 18 are readily deformed and damaged by pressing down thereof onto the electrical component of the signal waveform-rectifying sheet 20 at test stage. In order to solve such problem, it is recommended to arrange additionally a contact sheet 30 just on the signal waveform-rectifying sheet 20 as illustrated in FIG. 6.

The contact sheet 30 comprises an insulating substrate sheet 31 made of a heat resistant elastic material such as the fluoro-elastomer having a plurality of through-holes and a contact metal part 34 made of conductive metal, such as BoCu or carbon steel, are inserted and fixed in each of the through-holes. In a desirable embodiment, a top end of each contact metal part 34 is formed into a split-crown shape having at least two, preferably three or four, projections and a hemispherical or cylindrical recess in the central portion. The depth of the recess is deep enough for preventing contact with lower tip of the bump 18. An example of the contact metal part 34 having a shape of split-crown is disclosed in Japanese published patent application Kokai 2003-43104A. Each of the bumps 18 of IC 16 is brought into contact with the top end of the contact metal part 34. The bumps 18 are supported and connected at their side with the projections in top end of the contact metal part 34 as shown in FIG. 6. Thus, the tip of bump 18 does not contact directly with any electrical component and therefore any deformation or damaging of the tip of bump 18 can be prevented.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An anisotropically conductive sheet comprising:
   (a) an insulating sheet having a thickness, said insulating sheet comprising:
      an inner layer composed of a heat resistant fluoro-elastomer;
      thin surface layers composed of a heat resistant engineering plastic on both of an upper surface and a lower surface of said inner layer; and
      a plurality of through holes extending through said insulating sheet, said through holes having an axis extending the thickness of said insulating sheet and an inner surface;
   (b) a plurality of electrically conductive wire loops each of said loops having:
      a generally elliptical shape comprising a long axis and a short axis perpendicular to the long axis, the long axis and the short axis both lying in a plane of the generally elliptical shape; and
      two wire ends,
   wherein:
      said plurality of wire loops are inserted in said plurality of through holes of the insulating sheet such that said long axis of the generally elliptical shape of each wire loop is generally parallel to said hole axis of the through hole in which the wire loop is inserted, and
      said wire loops and said wire ends are in pressed contact with said inner surfaces of said through holes of the insulating sheet to hold said wire loops in said through holes.

2. An anisotropically conductive sheet as set forth in claim 1, wherein each of said through-holes provided in said insulating sheet has a circular cross section, the circular cross section having a substantially constant diameter throughout the thickness of the insulating sheet.

3. An anisotropically conductive sheet as set forth in claim 2, wherein said circular holes have a diameter of about 45% to about 65% of said thickness of said insulating sheet.

4. An anisotropically conductive sheet as set forth in claim 1, wherein each of said through-holes provided in said insulating sheet has a square cross section, the square cross section having a substantially constant width throughout the thickness of the insulating sheet.

5. An anisotropically conductive sheet as set forth in claim 1, wherein said inner layer of said insulating sheet has a thickness of about 0.15 mm to about 1.2 mm.

6. An anisotropically conductive sheet as set forth in claim 1, wherein said generally elliptical wire loops are made of a conductive metal wire composed of aluminum, gold, copper, iron or an alloy thereof.

7. An anisotropically conductive sheet as set forth in claim 6, wherein said conductive metal wire has a diameter of about 60 μm to about 200 μm.

8. An anisotropically conductive sheet as set forth in claim 6, wherein said generally elliptical wire loops are each formed by winding a conductive metal wire for three to ten turns.

9. An anisotropically conductive sheet as set forth in claim 6, in which a top and a bottom portion of said generally elliptical wire loops project out slightly from an upper end and a lower end of at least one of said plurality of through-holes of said insulating sheet.

10. An anisotropically conductive sheet as set forth in claim 1, in which each of said thin surface layers has a thickness of about 0.005 mm to about 0.1 mm.

11. An anisotropically conductive sheet as set forth in claim 1 wherein said thin surface layers are composed of polyimide or polyetheretherketone.

12. An apparatus for testing a semiconductor device comprising an anisotropically conductive sheet and an electrical circuit tester wherein said anisotropically conductive sheet is adapted to be placed between said semiconductor device and said electrical circuit tester to provide electrical connections between terminals on said semiconductor device and electrodes on said circuit tester, said anisotropically conducting sheet comprising:
   (a) an insulating sheet having a thickness, said insulating sheet comprising:
      an inner layer composed of a heat resistant fluoro-elastomer;
      thin surface layers composed of a heat resistant engineering plastic on both of an upper surface and a lower surface of said inner layer; and
      a plurality of through holes extending through said thickness of the insulating sheet, said through holes having an axis extending the thickness of said insulating sheet and an inner surface;
   (b) a plurality of electrically conductive wire loops, each of said loops having:
      a generally elliptical shape comprising a long axis and a short axis perpendicular to the long axis, the long axis and the short axis both lying in a plane of the generally elliptical shape; and
      two wire ends,
   wherein:
      said plurality of wire loops are inserted in said plurality of through holes of the insulating sheet such that said long axis of the generally elliptical shape of each wire loop is generally parallel to said hole axis of the through hole in which the wire loop is inserted, and said wire loops and said wire ends are in pressed contact with said inner surfaces of said through holes of the insulating sheet to hold said wire loops in said through holes.

13. An electrical interface for connecting terminals of a semiconductor device and corresponding electrodes of a tester for testing said semiconductor device, said interface comprising an anisotropically conductive sheet and a signal waveform-rectifying sheet for adjusting profiles of signal waves or electrical currents inputting into and/or outputting from said semiconductor device, said anisotropically conductive sheet comprising:
 (a) an insulating sheet having a thickness, said insulating sheet comprising:
  an inner layer composed of a heat resistant fluoro-elastomer;
  thin surface layers composed of a heat resistant engineering plastic on both of an upper surface and a lower surface of said inner layer; and
  a plurality of through holes extending through said thickness of the insulating sheet, said through holes having an axis extending the thickness of said insulating sheet and an inner surface;
 (b) a plurality of electrically conductive wire loops, each of said loops having:
  a generally elliptical shape comprising a long axis and a short axis perpendicular to the long axis, the long axis and the short axis both lying in a plane of the generally elliptical shape; and
  two wire ends,
 wherein:
  said plurality of wire loops are inserted in said plurality of through holes of the insulating sheet such that said long axis of the generally elliptical shape of each wire loop is generally parallel to said hole axis of the through hole in which the wire loop is inserted,
  said wire loops and said wire ends are in pressed contact with said inner surfaces of said through holes of the insulating sheet to hold said wire loops in said through holes; and
  said signal waveform-rectifying sheet comprises: a heat resistant insulating sheet comprising an elastomer and having a thickness, said heat resistant insulating sheet further comprising:
   a plurality of through-holes extending through said heat resistant insulating sheet thickness, and
   at least one signal waveform rectifying component arranged in at least one of said through-holes in said heat resistant insulating sheet.

14. An electrical interface as set forth in claim 13, wherein:
 at least one of said through holes in said signal waveform rectifying sheet connects to a signal input in said semiconductor device;
 at least one other of said through holes in said signal waveform rectifying sheet connects to a power or base line input in said semiconductor device;
 said signal waveform rectifying component in said through hole corresponding to said signal line of said semiconductor device is an electrical component selected from the group consisting of a resistor, LED, and LR circuit; and
 said signal waveform rectifying component in said through hole corresponding to said base line or power line of said semiconductor device is a capacitor.

15. An electrical interface as set forth in claim 13, further comprising:
 a contact sheet for electrically connecting terminals of said semiconductor device under test with said waveform rectifying components in said signal waveform rectifying sheet.

16. An electrical interface as set forth in claim 15, in which said contact sheet comprises an insulating sheet having through-holes and a contact metal part made of a conductive metal arranged in each of the through-holes, whereby said terminals of the semiconductor device under testing are connected with said signal waveform-rectifying component in said signal waveform-rectifying sheet.

17. An electrical interface set forth in claim 16, in which said terminals of the semiconductor device under testing are formed as ball like or semi-ball bumps.

18. An electrical interface set forth in claim 17, in which a top end of said contact metal part is formed as a split-crown shape having at least two projections and a hemispherical or cylindrical recess in central portion thereof, so that said bumps are supported and contacted with the projections of said contact metal part.

* * * * *